(12) United States Patent  
Hjelm

(10) Patent No.: US 7,501,901 B2
(45) Date of Patent: Mar. 10, 2009

(54) CIRCUIT COMPRISING A CAPACITIVE CIRCUIT COMPONENT

(75) Inventor: Mikael Hjelm, Västeras (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/468,103

(22) Filed: Aug. 29, 2006

(65) Prior Publication Data

US 2008/0068095 A1    Mar. 20, 2008

(51) Int. Cl.
*H03B 1/00*    (2006.01)
(52) U.S. Cl. ................. 331/16; 327/558; 327/552
(58) Field of Classification Search ............ 331/16, 331/17, 18, 25; 327/156, 157, 538, 540, 327/541, 543, 552, 558; 330/85
See application file for complete search history.

(56) References Cited

U.S. PATENT DOCUMENTS

| | | | | |
|---|---|---|---|---|
| 4,587,437 A * | 5/1986 | Schorr | | 307/109 |
| 5,726,599 A * | 3/1998 | Genest | | 327/553 |
| 5,774,023 A | 6/1998 | Irwin | | 331/17 |
| 6,075,391 A | 6/2000 | Tarantola et al. | | 327/111 |
| 6,344,772 B1 * | 2/2002 | Larsson | | 327/552 |
| 6,351,137 B1 | 2/2002 | Hariton | | 326/30 |
| 6,646,463 B1 * | 11/2003 | Hariton | | 326/30 |
| 2007/0090872 A1 * | 4/2007 | Chen et al. | | 327/552 |

* cited by examiner

*Primary Examiner*—Robert Pascal
*Assistant Examiner*—Ryan J. Johnson
(74) *Attorney, Agent, or Firm*—Dicke, Billig & Czaja, PLLC

(57) ABSTRACT

A circuit has a first capacitive circuit component, having a first terminal and a second terminal, and an amplifier, having a first input and an output, the first input coupled to the first terminal and the output coupled to the second terminal to generate a potential difference between the first terminal and the second terminal.

27 Claims, 8 Drawing Sheets

CIRCUIT COMPRISING A CAPACITIVE CIRCUIT COMPONENT

TECHNICAL FIELD

This invention generally relates to a circuit comprising a capacitive circuit component and more particularly to a device emulating a capacitance. The circuit and the device may be adapted to be utilized in a filter or a phase-locked loop (PLL) device.

SUMMARY

A circuit may comprise a first capacitive circuit component, having a first terminal and a second terminal, and an amplifier, having a first input and an output, the first input coupled to the first terminal and the output coupled to the second terminal to generate a potential difference between the first terminal and the second terminal.

DETAILED DESCRIPTION

Figure 1:
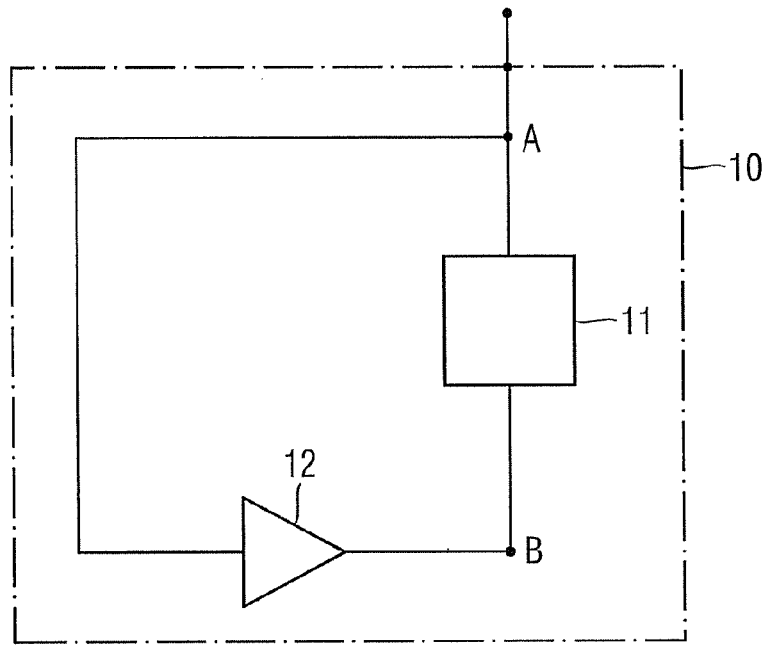
FIG. 1 schematically illustrates a circuit 10 according to an exemplary embodiment.

One or more aspects and/or embodiments are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments. It may be evident, however, to one skilled in the art that one or more aspects of the embodiments may be practiced with a lesser degree of these specific details. In other instances, known structures and devices are shown in block diagram form in order to facilitate describing one or more aspects of the embodiments. The following description is therefore not to be taken in a limiting sense, and the scope is defined by the appended claims.

FIG. 1 shows a schematic circuit diagram of a circuit 10 according to an exemplary embodiment. The circuit 10 comprises circuit nodes A and B, a capacitive circuit component 11 having two terminals and an amplifier 12 having an input and an output.

In the exemplary embodiment shown in FIG. 1 the circuit node A is an input terminal of the circuit 10. One terminal of the capacitive circuit component 11 is coupled to the circuit node A. The other terminal of the capacitive circuit component 11 is coupled to the circuit node B. The input of the amplifier 12 is coupled to the circuit node A and its output is coupled to the circuit node B.

Each of the circuit nodes A and B may be any sort of circuit node, for example a location on a conductor, circuit path or printed circuit board track or a bonding, crossing or junction of conductors or circuit paths or a terminal of a circuit component, such as an input or output.

The capacitive circuit component 11 may be any sort of circuit component that exhibits a capacitance, for example a capacitor, a network of capacitors, a varactor, a network of capacitors and other circuit components, for example resistors, or any other circuit that forms a capacitance between the circuit nodes A and B.

The amplifier 12 generates an electrical potential at the circuit node B by amplifying the electrical potential at the circuit node A, thus generating a potential difference between the two terminals of the capacitive circuit component 11. The potentials are measured with respect to a reference potential, for example ground.

Increasing the voltage drop over the capacitive circuit component 11 increases the amount of electric charges stored on the capacitance of the capacitive circuit component 11. Thus, when measuring the capacitance at the circuit node A, the measured capacitance of the circuit 10 is larger when a potential difference is applied to the terminals of the capacitive circuit component 11 in comparison to the capacitance that is measured when no potential difference is applied to the terminals of the capacitive circuit component 11. In other words, the circuit node A replicates a terminal of an emulated capacitance wherein the magnitude of the emulated capacitance depends on the gain of the amplifier 12. According to one embodiment, the gain of the amplifier 12 is negative.

In some circuit designs there is a need for capacitors having a relatively large capacitance. Such a capacitor may for example be fabricated by a capacitor being large in area. If this capacitor is implemented in an integrated circuit, the capacitor may occupy a significant portion of the total die area, thereby increasing the die area or limiting the area available for the remaining components of the circuit. Since the die size is linked to device cost, there is an economic incentive to avoid circuits that require a capacitor occupying a large area. An advantage of the circuit 10 is that it allows to replicate or emulate a capacitor having a large capacitance without requiring a large area.

According to one embodiment, the circuit 10 is implemented in an integrated circuit. Circuit components may be used for the implementation of the circuit 10 that are readily available in integrated circuit design.

Figure 2:
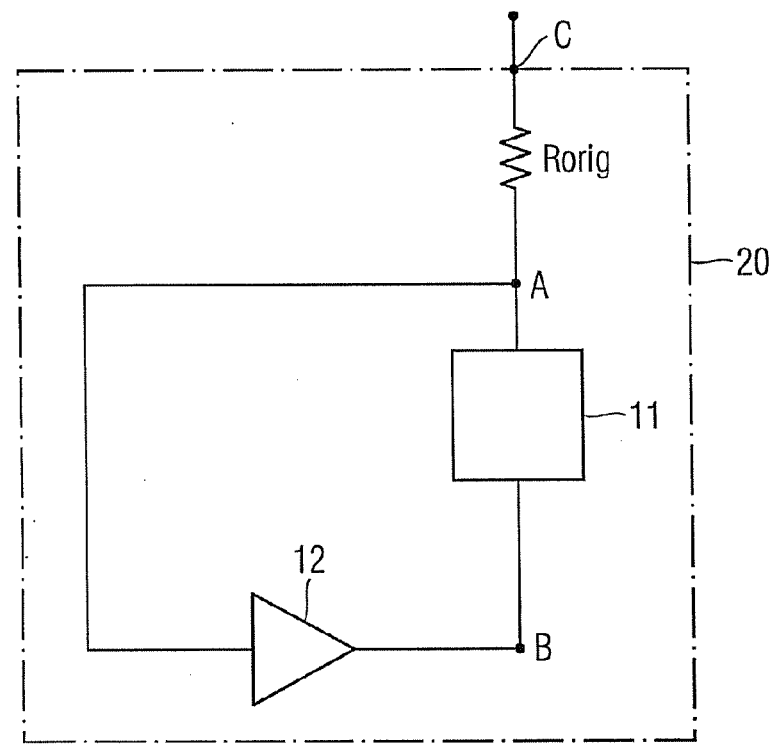
FIG. 2 schematically illustrates a circuit 20 according to a further exemplary embodiment.

FIG. 2 shows a schematic circuit diagram of a circuit 20 according to a further exemplary embodiment. The circuit 20 is almost identical to the circuit 10 shown in FIG. 1. The difference between the circuits 10 and 20 is that the circuit 20 comprises a resistor Rorig, which is connected between a circuit node C, which is an input terminal of the circuit 20, and the circuit node A.

Figure 3:
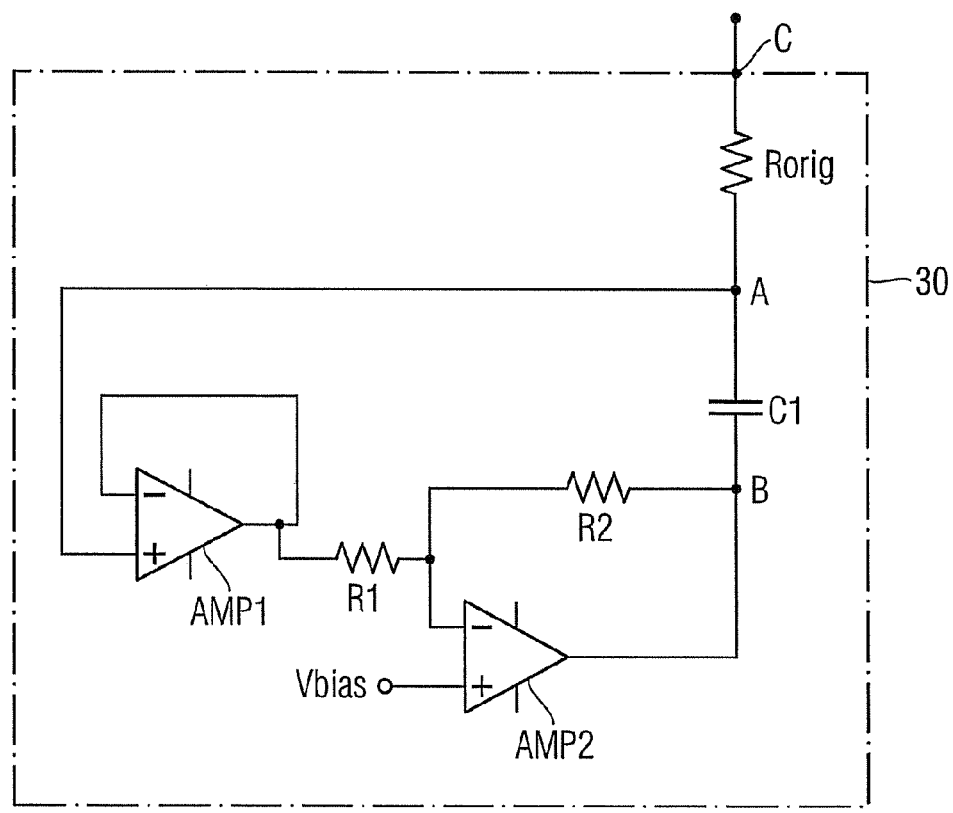
FIG. 3 schematically illustrates a circuit 30 according to a further exemplary embodiment.

FIG. 3 shows a schematic circuit diagram of a circuit 30 according to a further exemplary embodiment. The circuit 30 comprises circuit nodes A, B and C, a capacitor C1, amplifiers AMP1 and AMP2 as well as resistors Rorig, R1 and R2. Each of the amplifiers AMP1 and AMP2 has a negative input, a positive input and an output. The amplifiers AMP1 and AMP2 may for example be implemented as operational amplifiers.

The circuit node C, which serves as an input terminal of the circuit 30 in the exemplary embodiment shown in FIG. 3, is connected to a terminal of the resistor Rorig. The other terminal of the resistor Rorig is connected to the circuit node A. The circuit node A is further connected to a terminal of the capacitor C1 and the positive input of the amplifier AMP1. The negative input of the amplifier AMP1 is connected to the output thereof in a direct feedback loop. The output of the amplifier AMP1 is further connected to a terminal of the resistor R1. The other terminal of the resistor R1 is connected to the negative input of the amplifier AMP2. The negative input terminal of the amplifier AMP2 is connected to the output thereof in a feedback loop comprising the resistor R2. A reference potential Vbias, which may for example be generated inside or outside the circuit 30, is applied to the positive input of the amplifier AMP2. The output of the amplifier AMP2 is connected to the other terminal of the capacitor C1 via the circuit node B.

The function of the circuit 30 is the following. The amplifier AMP1 is configured as a voltage follower with a gain of +1. The amplifier AMP1 thus replicates the potential at the circuit node A (with respect to a reference potential, for example ground) to provide it to the resistor R1. The amplifier AMP2 is configured as an inverting amplifier with a negative gain of $-R2/R1$. The resistor R1 forms the input resistor of the amplifier AMP2. The potential VB of the circuit node B is the following, wherein VA denotes the potential at the circuit node A and both potentials VA and VB are referenced to a ground potential VSS:

$$VB - VSS = -\frac{R2}{R1} \cdot (VA - Vbias) \quad (1)$$

Equation (1) demonstrates that the potential VB at the circuit node B depends on the gain $-R2/R1$ of the inverting amplifier AMP2 and the reference potential Vbias. An increase of the voltage drop over the capacitor C1 leads to an increase of the amount of electric charges stored on the capacitor C1. Thus, when increasing the voltage drop over the capacitor C1, the capacitance measured at the circuit node C increases as well. Therefore, the circuit node C may for example be used as a terminal of an emulated capacitance.

The reference potential Vbias is, for example, selected such that there is a maximum potential swing possible at the output of the amplifier AMP2. The reference potential Vbias may, for example, be half of the supply potential if there is only one supply potential which is measured versus ground. If there are a positive and a negative supply potential, the reference potential Vbias may for example be the midpoint potential between the two supply potentials.

Figure 3A:
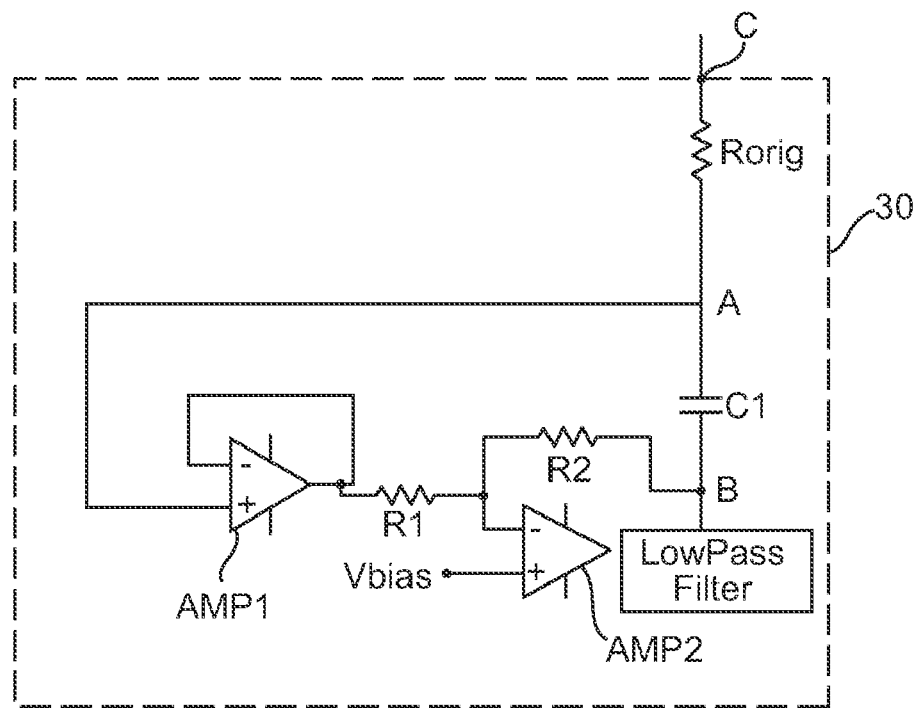
FIG 3A schematically illustrates a circuit 30' according to a further exemplary embodiment.

According to one embodiment illustrated in Figure 3A, a low-pass filter is connected between the output of the amplifier AMP2 and the circuit node B in a circuit 30'.

Figure 4:
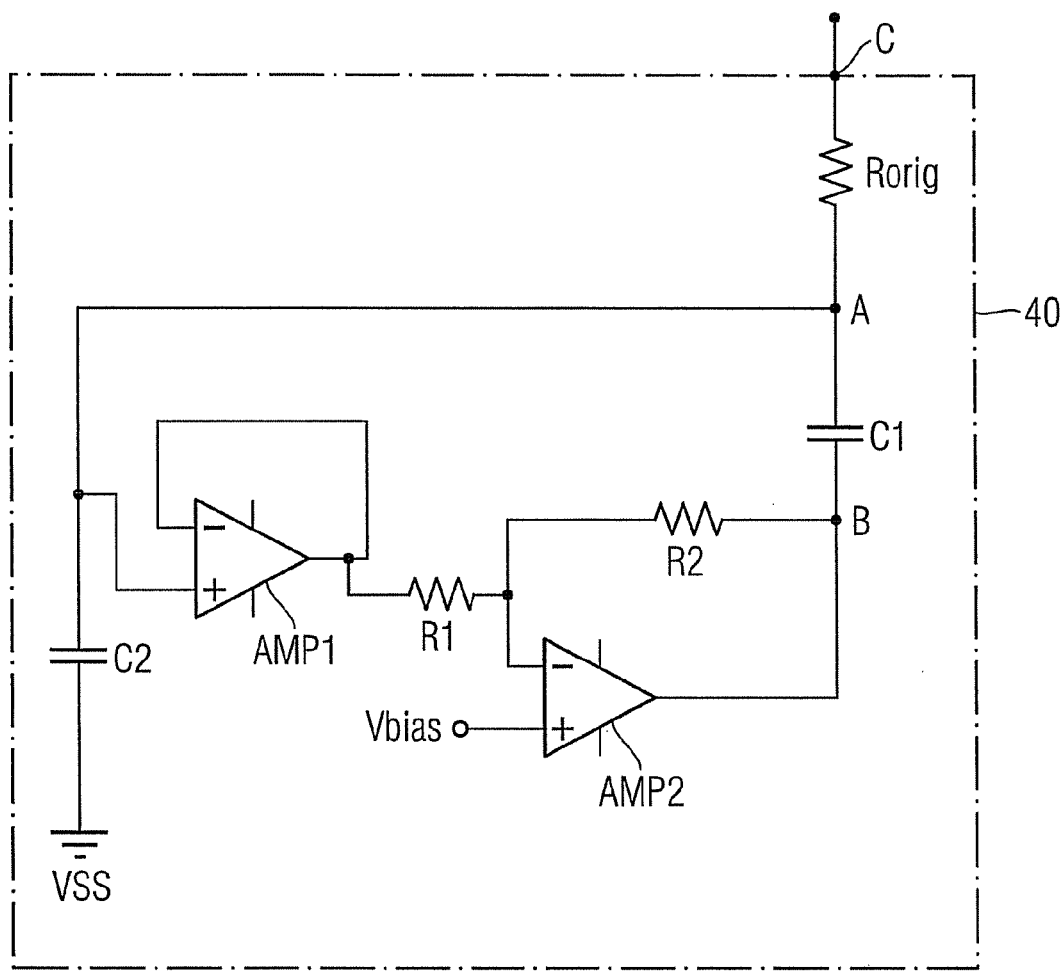
FIG. 4 schematically illustrates a circuit 40 according to a further exemplary embodiment.

FIG. 4 shows a schematic circuit diagram of a circuit 40 according to a further exemplary embodiment. The circuit 40 is almost identical to the circuit 30 shown in FIG. 3. The difference between the circuits 30 and 40 is that the circuit 40 comprises a capacitor C2, which is coupled between the circuit node A and the ground potential VSS. An advantage of the capacitor C2 is that it creates a capacitance between the circuit node A and the ground potential VSS even if the amplifiers AMP1 and AMP2 run out of bandwidth which may happen at high frequencies.

Figure 5:
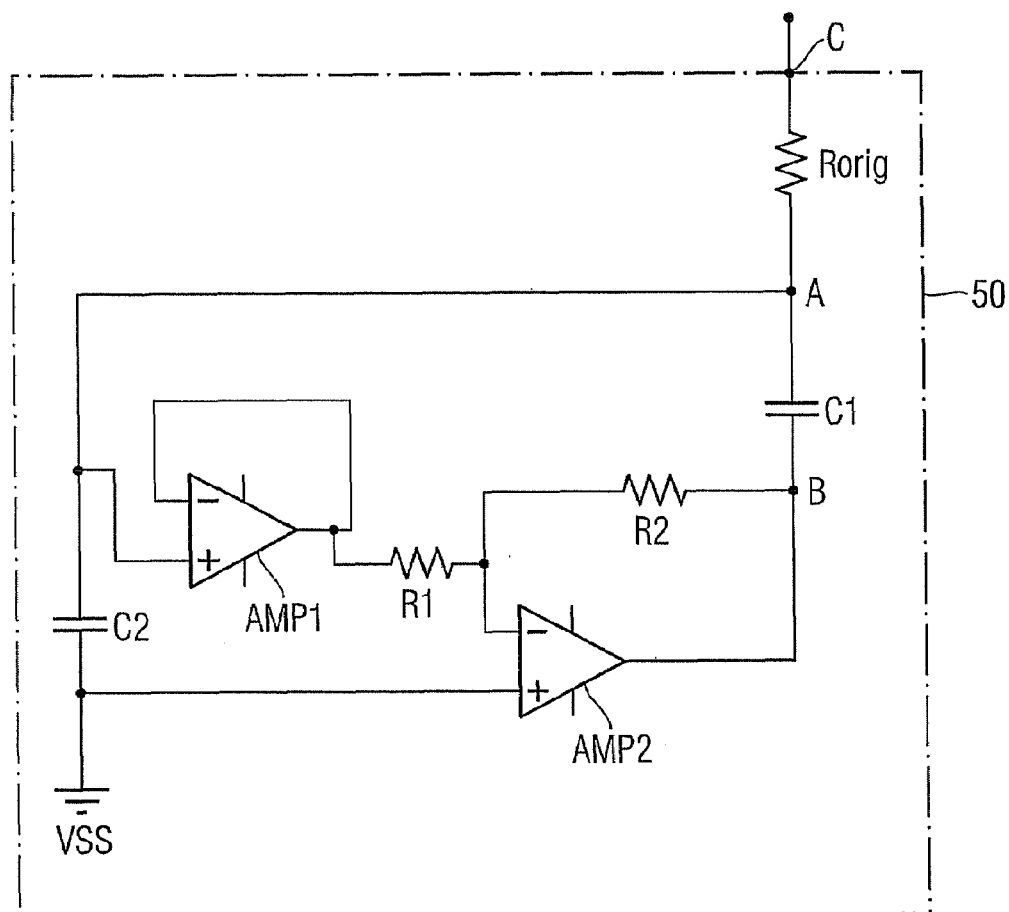
FIG. 5 schematically illustrates a circuit 50 according to a further exemplary embodiment.

FIG. 5 shows a schematic circuit diagram of a circuit 50 according to a further exemplary embodiment. The circuit 50 is almost identical to the circuit 40 shown in FIG. 4. The difference between the circuits 40 and 50 is that in the circuit 50 the ground potential VSS instead of the reference potential Vbias is applied to the positive input of the amplifier AMP2.

The emulated capacitance $C_{emulated}$ measured at the circuit node C of the circuit 50 can be calculated by the following equation:

$$C_{emulated} = C2 + C1 \cdot \left(1 + \frac{R2}{R1}\right) \quad (2)$$

If the capacitor C2 is omitted, the emulated capacitance $C_{emulated}$ can be calculated by the following equation:

$$C_{emulated} = C1 \cdot \left(1 + \frac{R2}{R1}\right) \quad (3)$$

The circuits 10, 20, 30, 40 and 50 demonstrated that one or two capacitors with small capacitances can be used to emulate a capacitor with a larger capacitance without requiring a large area.

Figure 6:
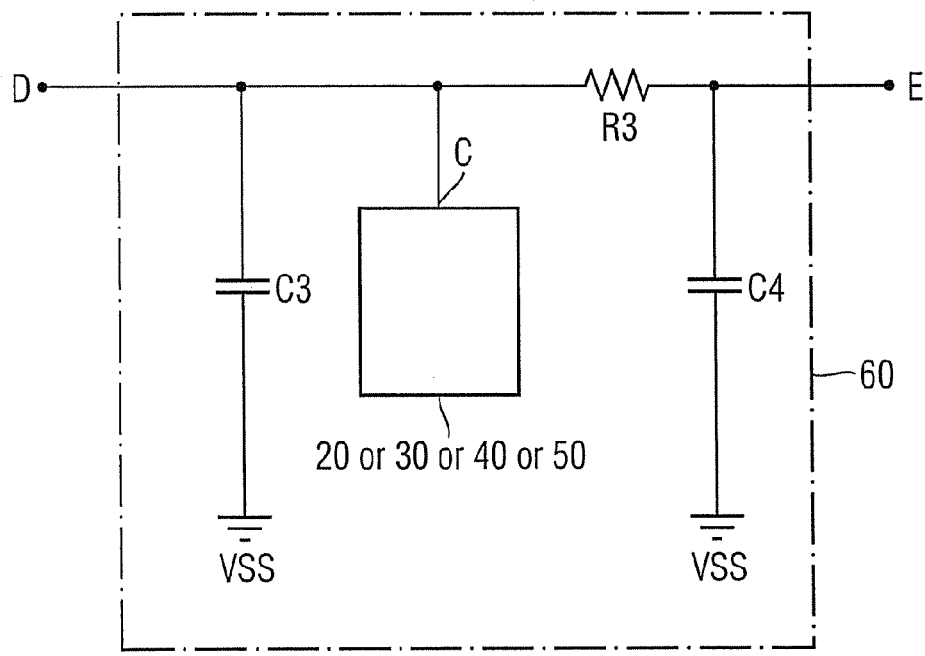
FIG. 6 schematically illustrates a filter 60 according to a further exemplary embodiment.

FIG. 6 shows a schematic circuit diagram of a low-pass filter 60 according to a further exemplary embodiment. The low-pass filter 60 comprises an input D, an output E, capacitors C3 and C4 as well as a resistor R3.

The capacitor C3 is coupled between the input D and the ground potential VSS. The capacitor C3 causes a pole of the transfer function of the low-pass filter 60.

The resistor R3 is coupled between the input D and the output E. The capacitor C4 is coupled between the output E and the ground potential VSS. The resistor R3 and the capacitor C4 perform the low-pass function of the low-pass filter 60.

Figure 7:
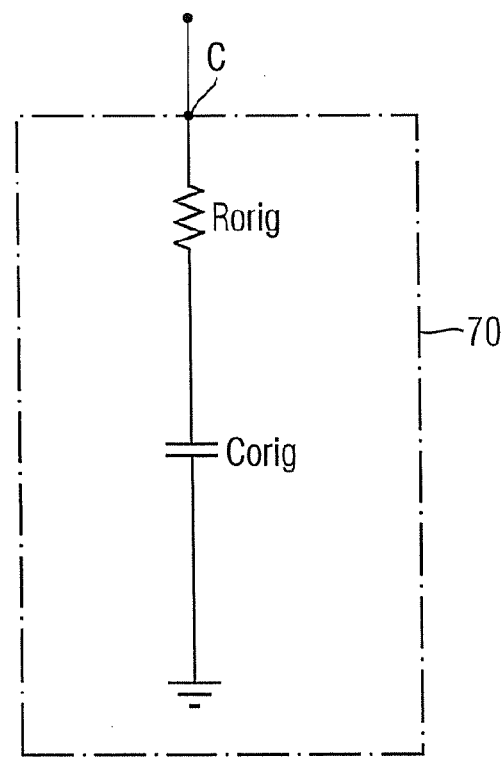
FIG. 7 schematically illustrates a circuit 70.

In case an extra pole of the transfer function of the low-pass filter 60 is required, a series connection of a resistor and a further capacitor may, for example, be coupled between the input D and the ground potential VSS. For example, a circuit 70 comprising such a series connection of a resistor Rorig and a capacitor Corig is shown in FIG. 7. According to one embodiment, instead of the circuit 70, one of the circuits 20, 30, 40 and 50 is integrated in the low-pass filter 60. In this case, the circuit node C of the circuit 20, 30, 40 or 50 is coupled to the input D of the low-pass filter 60 as shown in FIG. 6. One advantage of using one of the circuits 20, 30, 40 and 50 for creating the extra pole is that these circuits facilitate a large capacitance without requiring a large die area.

According to one embodiment, a unit driving the low-pass filter 60 has a current output which is connected to the input D of the low-pass filter 60.

Figure 8:
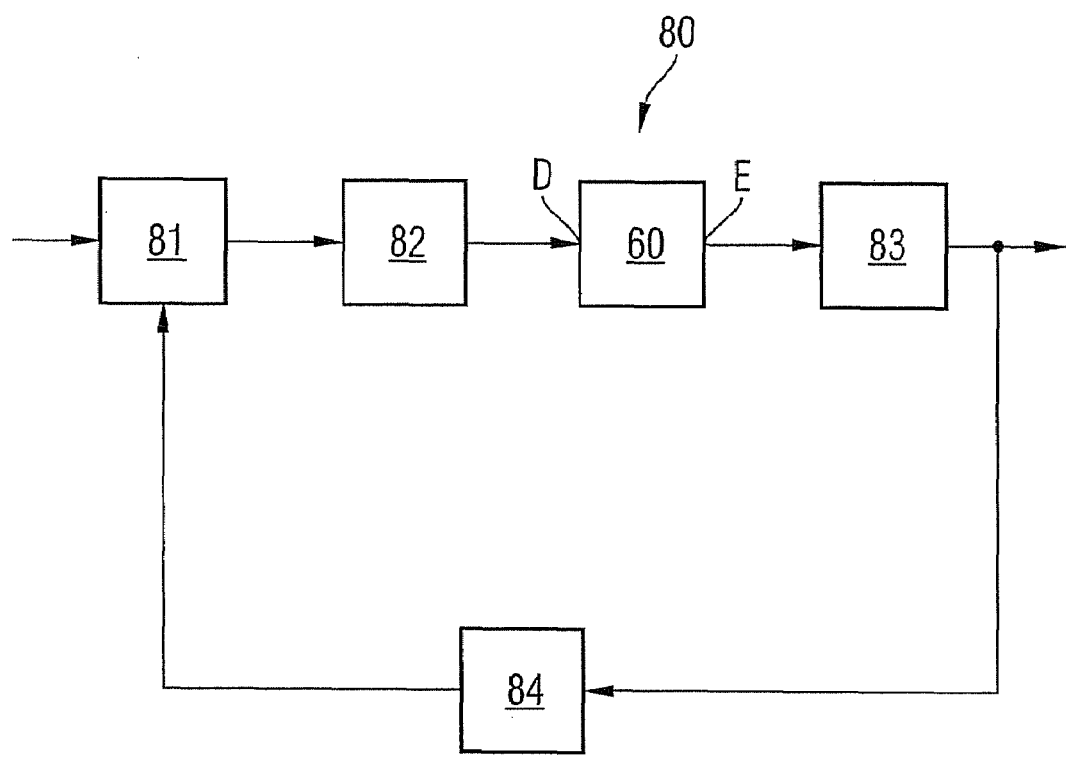
FIG. 8 schematically illustrates a phase-locked loop device 80 according to a further exemplary embodiment.

FIG. 8 shows a schematic circuit diagram of a phase-locked loop device 80 according to a further exemplary embodiment. The phase-locked loop device comprises a phase detector 81, a charge pump 82, a loop filter 60, a voltage-controlled oscillator 83 and a frequency divider 84. The phase detector 81, the charge pump 82, the loop filter 60 and the voltage-controlled oscillator 83 are coupled in series. The output of the voltage-controlled oscillator 83 is coupled back, via the frequency divider 84, to one of the inputs of the phase detector and forms a feedback circuit.

The phase detector 81 receives a reference signal, which is for example generated by a reference clock generator, at one of its inputs and the output signal from the frequency divider 84 at its other input. The phase detector 81 generates an output signal which reflects the phase difference between the two input signals of the phase detector 81. The output signal of the phase detector 81 is received as input by the charge pump 82. The output signal of the charge pump 82 is filtered in the loop filter 60 and provided to the voltage-controlled oscillator 83. The voltage-controlled oscillator 83 generates an output signal, the frequency of which depends on the input signal of the voltage-controlled oscillator 83. The output signal of the voltage-controlled oscillator 83 is fed to the frequency divider 84, which divides this signal by a given number and feeds the divided signal to the phase detector 81.

For example, the charge pump 82 and/or the frequency divider 84 can be omitted from the phase-locked loop device 80. In the latter case, the output signal of the voltage-controlled oscillator 83 is directly fed back to the phase detector 81.

According to one embodiment, the low-pass filter 60 comprising one of the circuits 20, 30, 40 and 50 is used as the loop filter 60 of the phase-locked loop device 80.

According to one embodiment, the phase-locked loop device 80 is a type 2 or higher phase-locked loop. A type 2 or higher phase-locked loop comprises at least one integrator in the loop filter, whereas a type 1 phase-locked loop does not have an integrating term in the loop filter. At lock, the average output of the phase detector of a type 2 phase-locked loop does not cause the integrator to ramp. In a type 1 phase-locked loop, at lock, the phase between the input and the output varies with the frequency difference between the input and the free running frequency signal of the voltage-controlled oscillator.

A type 2 phase-locked loop may require a pole in order to increase the stability of its transfer function. According to one embodiment, this is achieved by one of the circuits 20, 30, 40 and 50 which emulates a capacitance of a predetermined magnitude.

Figure 9:
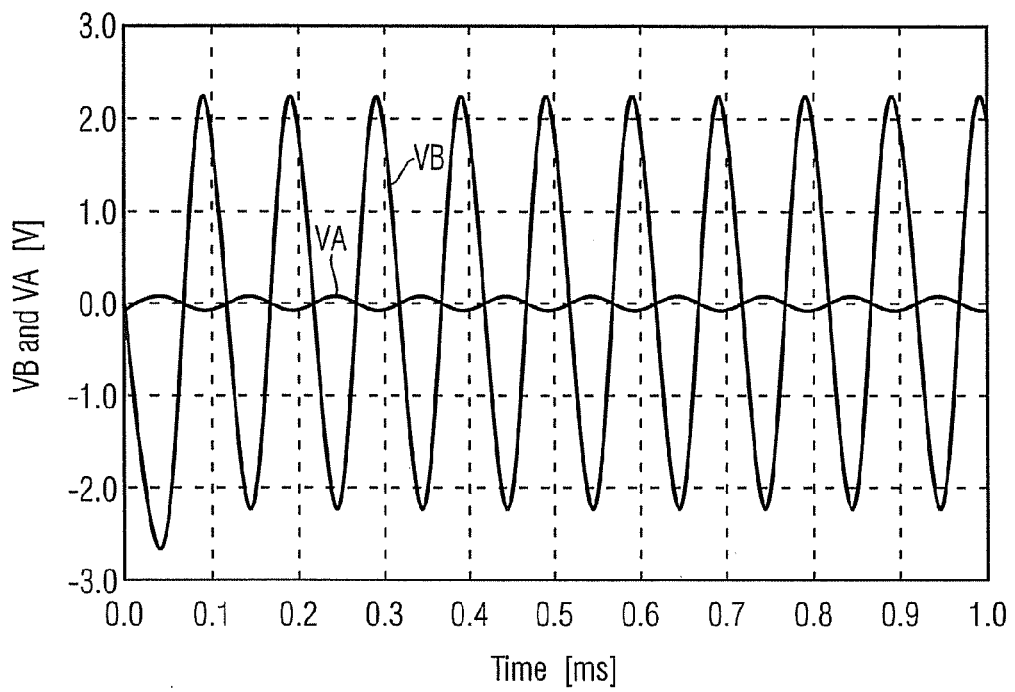
FIG. 9 illustrates a simulation of the behavior of the circuit 50 over time.
Figure 10:
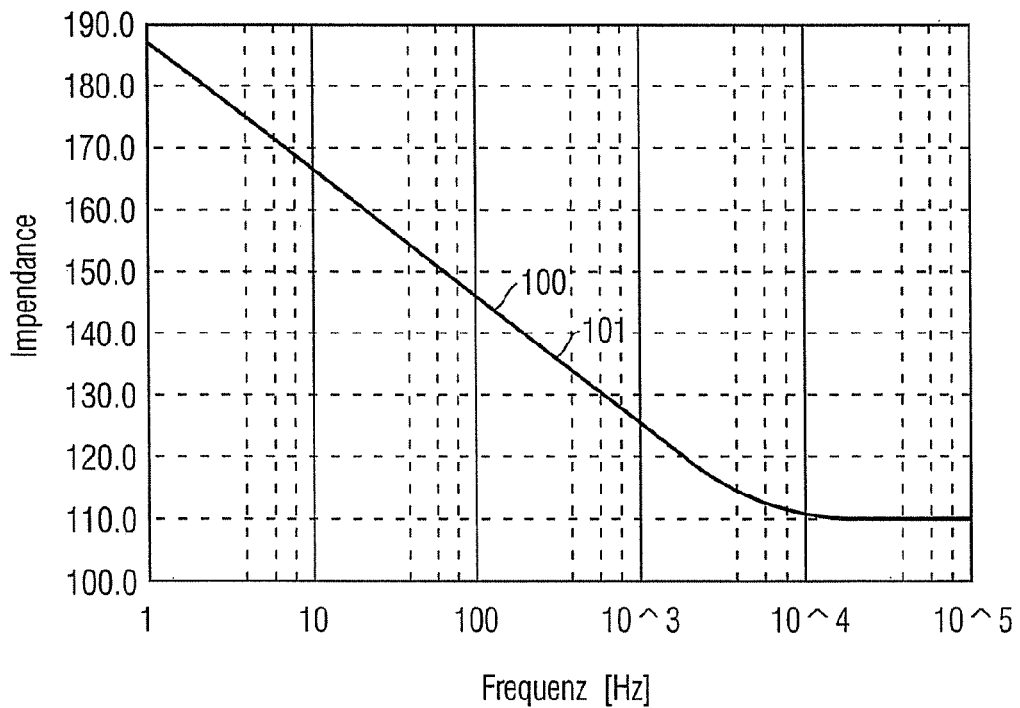
FIG. 10 illustrates simulations of the behavior of the circuits 50 and 70 over frequency.

The behavior of a practical example of the circuit 40 is shown in FIGS. 9 and 10. In FIG. 9 a simulation of the potential VB at the circuit node B versus time is shown. The simulation is based on a given alternating potential VA at the circuit node A. FIG. 10 depicts the logarithmic impedance 100 of the circuit 50 versus frequency and compares it with the logarithmic impedance 101 of the circuit 70. The following values are used for the simulations shown in FIGS. 9 and 10:

Rorig=50 kΩ

R1=2.5 kΩ

R2=113.75 kΩ

C1=2 pF

C2=1 pF

Corig=92 pF

It is apparent from FIG. 10 that the impedances 100 and 101 of the circuits 50 and 70 are almost the same. Thus the circuit 70 may be emulated by the circuit 50. A capacitor Corig of such large value as 92 pF would occupy an impractically large area on a silicon die. The circuit 50 emulates this large capacitance using components easily formed in silicon and occupying a small die area.

In addition, while a particular feature or aspect of an embodiment may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A circuit, comprising:
a first capacitive circuit component, having a first terminal and a second terminal,
an amplifier, having a first input, a second input, and an output, the first input coupled to the first terminal, the second input to a first reference potential, to amplify a potential difference between a potential of the first input and the first reference potential, and the output coupled to the second terminal to generate a potential difference between the first terminal and the second terminal,
a second capacitive circuit component coupled between the first terminal and a second reference potential, and
a resistor having a resistor terminal directly to the first terminal and the second capacitive circuit component.

2. A circuit according to claim 1, wherein the amplifier has a negative gain.

3. A circuit according to claim 1, further comprising:
a voltage follower coupled between the first terminal and the first input of the amplifier.

4. A circuit according to claim 1, further comprising:
a low-pass filter coupled between the output of the amplifier and the second terminal.

5. A circuit according to claim 1, wherein the first and second reference potentials are equal.

6. A circuit according to claim 1, further comprising:
an alternating voltage generator, coupled to the first terminal, to generate an alternating potential at the first terminal.

7. A device, comprising:
a first circuit node,
a second circuit node,
a first capacitive circuit component, having a first terminal and a second terminal, the first terminal coupled to the first circuit node and the second terminal coupled to the second circuit node,
an amplifier, having a first input, a second input, and an output, the first input coupled to the first circuit node, the second input coupled to a first reference potential, to amplify potential difference between a potential of the first circuit node and the first reference potential, and the output coupled to the second circuit node, wherein the first circuit node replicates a terminal of an emulated capacitance,
a second capacitive circuit component coupled between the first circuit node and a second reference potential, and
a resistor having a resistor terminal directly coupled to the first circuit node and the second capacitive circuit component.

8. A circuit according to claim 7, wherein a magnitude of the emulated capacitance depends on a gain of the amplifier.

9. A circuit according to claim 7, wherein a gain of the amplifier is negative.

10. A circuit according to claim 7, further comprising:
a voltage follower coupled between the first circuit node and the first input of the amplifier.

11. A circuit according to claim 7, further comprising:
a low-pass filter coupled between the output of the amplifier and the second circuit node.

12. A device, comprising:
a first circuit node,
a second circuit node,
means for generating a first capacitance between the first circuit node and the second circuit node,
means for generating a potential difference between the first circuit node and the second circuit node to emulate a terminal of an emulated capacitance at the first circuit node,
means for generating a second capacitance between the first circuit node and a reference potential, and
means for providing a resistance directly coupled to the first circuit node and the second capacitance.

13. A circuit according to claim 12, wherein a value of the emulated capacitance depends on a value of the potential difference.

14. A filter, comprising:
a first capacitive circuit component, having a first terminal and a second terminal,
an amplifier, having an input, a second input, and an output, the input coupled to the first terminal, the second input coupled to a first reference potential, to amplify a potential difference between a potential of the first input and the first reference potential, and the output coupled to the second terminal to generate a potential difference between the first terminal and the second terminal,
a second capacitive circuit component coupled between the first terminal and a second reference potential, and
a resistor having a resistor terminal directly coupled to the first terminal and the second capacitive circuit component.

15. A filter according to claim 14, wherein the first capacitive circuit component generate a pole of a transfer function of the filter.

16. A filter, comprising:
a first circuit node,
a second circuit node,
a first capacitive circuit component, having a first terminal and a second terminal, the first terminal coupled to the first circuit node and the second terminal coupled to the second circuit node,
an amplifier, having an input, a second input, and an output, the input coupled to the first circuit node, the second input coupled to a first reference potential, to amplify a potential difference between a potential of the first circuit node and the first reference potential, and the output coupled to the second circuit node, wherein the first circuit node replicates a terminal of an emulated capacitance,
a second capacitive circuit component coupled between the first circuit node and a second reference potential, and
a resistor having a resistor terminal directly coupled to the first circuit node and the second capacitive circuit component.

17. A filter according to claim 16, wherein the first capacitive circuit component generates a pole of a transfer function of the filter.

18. A phase-locked loop device, comprising:
a loop filter, comprising: a first capacitive component, having a first terminal and a second terminal,
an amplifier, having an input, a second input, and an output, the input coupled to the first terminal, the second input coupled to a first reference potential, to amplify potential difference between a potential of the first input and the first reference potential, and the output coupled to the second terminal to generate a potential difference between the first terminal and the second terminal,
a second capacitive circuit component coupled between the first terminal and a second reference potential, and
a resistor having a resistor terminal directly coupled to the first terminal and the second capacitive circuit component.

19. A phase-locked loop device according to claim 18, wherein the amplifier has a negative gain.

20. A phase-locked loop device according to claim 18, wherein the first capacitive circuit component generates a pole of a transfer function of the phase-locked loop device.

21. A phase-locked loop device according to claim 18, wherein the phase-locked loop device is a type 2 phase-locked loop device.

22. A phase-locked loop device, comprising:
a loop filter, comprising:
a first circuit node,
a second circuit node,
a first capacitive circuit component, having a first terminal and a second terminal, the first terminal coupled to the first circuit node and the second terminal coupled to the second circuit node,
an amplifier, having a first input, a second input, and an output, the first input coupled to the first circuit node, the second input coupled to a first reference potential, to amplify a potential difference between a potential of the first circuit node and the first reference potential, and the output coupled to the second circuit node, wherein the first circuit node replicates a terminal of an emulated capacitance,
a second capacitive circuit component coupled between the first circuit node and a second reference potential, and
a resistor having a resistor terminal directly coupled to the first circuit node and the second capacitive circuit component.

23. A phase-locked loop device according to claim 22, wherein a value of the emulated capacitance depends on a gain of the amplifier.

24. A phase-locked loop device according to claim 22, wherein the first capacitive circuit component generates a pole of a transfer function of the phase-locked loop device.

25. A phase-locked loop device according to claim 22, wherein the phase-locked loop device is a type 2 phase-locked loop device.

26. A circuit, comprising:
a first capacitive circuit component including a first terminal and a second terminal,
an amplifier including a first input, a second input, and an output, the first input coupled to the first terminal, the second input coupled to a first reference potential, to amplify a potential difference between a potential of the first input and the first reference potential, and the output coupled to the second terminal to generate a potential difference between the first terminal and the second terminal,
a second capacitive circuit component including a first terminal directly coupled to the first terminal of the first capacitive circuit component and a second terminal coupled to a second reference potential, and a resistor including a resistor terminal coupled to the first terminal of the first capacitive circuit component.

27. A circuit, comprising:

a first capacitive circuit component including a first terminal and a second terminal, an amplifier including a first input, a second input, and an output, the first input coupled to the first terminal, the second input coupled to a first reference potential, to amplify a potential difference between a potential of the first input and the first reference potential, and the output coupled to the second terminal to generate a potential difference between the first terminal and the second terminal, a second capacitive circuit component coupled between the first terminal of the first capacitive circuit component and a second reference potential, and including a first terminal which is at the same potential as the first terminal of the first capacitive circuit component, and a resistor including a resistor terminal coupled to the first terminal of the first capacitive circuit component.

* * * * *

UNITED STATES PATENT AND TRADEMARK OFFICE
CERTIFICATE OF CORRECTION

PATENT NO. : 7,501,901 B2 Page 1 of 1
APPLICATION NO. : 11/468103
DATED : March 10, 2009
INVENTOR(S) : Hjelm It is certified that error appears in the above-identified patent and that said Letters Patent is hereby corrected as shown below:

Column 6, line 56, delete "potential" and insert in place thereof --a potential--.

Column 8, line 2, insert paragraph return after "comprising:".

Column 8, line 6, delete "potential" and insert in place thereof --a potential--.

Signed and Sealed this

Twenty-third Day of June, 2009

JOHN DOLL
*Acting Director of the United States Patent and Trademark Office*